United States Patent [19]

Ashton et al.

[11] Patent Number: 5,051,598
[45] Date of Patent: Sep. 24, 1991

[54] METHOD FOR CORRECTING PROXIMITY EFFECTS IN ELECTRON BEAM LITHOGRAPHY

[75] Inventors: Christopher J. Ashton, Harrison; Porter D. Gerber, White Plains; Dieter P. Kern, Amawalk; Walter W. Molzen, Jr., Holmes; Stephen A. Rishton, Yorktown Heights, all of N.Y.; Michael G. Rosenfield, Ridgefield, Conn.; Raman G. Viswanathan, Briarcliff Manor, N.Y.

[73] Assignee: International Business Machines Corporation, Armonk, N.Y.

[21] Appl. No.: 580,979

[22] Filed: Sep. 12, 1990

[51] Int. Cl.$^5$ .......................................... H01J 37/302
[52] U.S. Cl. ............................. 250/492.2; 250/492.1; 250/492.3
[58] Field of Search .................. 250/492.2 R, 492.22, 250/492.23, 492.3, 398; 430/296

[56] References Cited

U.S. PATENT DOCUMENTS

| | | | |
|---|---|---|---|
| 4,099,062 | 7/1978 | Kitcher | 250/492.22 |
| 4,264,711 | 4/1981 | Greeneich | 250/492.22 |
| 4,426,564 | 1/1984 | Steigerwald et al. | 219/10.77 |
| 4,426,584 | 1/1984 | Bohlen et al. | 250/492.22 |
| 4,498,010 | 2/1985 | Biechler et al. | 250/492.22 |
| 4,504,558 | 3/1985 | Bohlen et al. | 250/492.22 |
| 4,520,269 | 5/1985 | Jones | 250/492.22 |
| 4,644,170 | 2/1987 | Komatsu | 250/492.22 |

*Primary Examiner*—Jack I. Berman
*Assistant Examiner*—Kiet T. Nguyen
*Attorney, Agent, or Firm*—Whitham & Marhoefer

[57] ABSTRACT

A proximity effect correction method for electron beam lithography suitable for high voltages and/or very dense patterns applies both backscatter and forward scatter dose corrections. Backscatter dose corrections are determined by computing two matrices, a "Proximity Matrix" P and a "Fractional Density Matrix" F. The Proximity Matrix P is computed using known algorithms. The elements of the Fractional Density Matrix are the fractional shape coverage in a mesh of square cells which is superimposed on a pattern of interest. Then, a Dose Correction Matrix D is computed by convolving the P and F matrices. The final backscatter dose corrections are assigned to each shape either as area-weighted averages of the D matrix elements for all cells spanned by the shape, or by polynomial or other interpolation of the dose correction field defined by the D matrix. The D matrix also provides a basis for automatic shape fracturing for optimal proximity correction. Optionally, forward scattering correction may be included in the correction process. Forward scattering correction consists of boosting the dose applied to shape i by a factor $b_i$. These boost factors are computed in a separate and independent step which considers only forward scattering. They are combined with those resulting from the backscatter correction scheme either by simple multiplication to form the final correction factors, or by inputting them to the backscatter correction scheme as numerical weights for each shape.

6 Claims, 4 Drawing Sheets

METHOD FOR CORRECTING PROXIMITY EFFECTS IN ELECTRON BEAM LITHOGRAPHY

BACKGROUND OF THE INVENTION

1. Field of the Invention

The present invention generally relates to the technology of electron beam lithography, and more specifically to a method for proximity effect correction in high voltage electron beam lithography systems. The invention may also advantageously be applied to proximity correction of very dense patterns at lower beam voltages.

2. Description of the Prior Art

U.S. Pat. No. 4,264,711 issued Apr. 28, 1981, to Greeneich entitled METHOD OF COMPENSATING FOR PROXIMITY EFFECTS IN ELECTRON-BEAM LITHOGRAPHY describes a process of constructing microelectronic circuits on a semiconductor chip wherein electron-beam lithography is utilized to fabricate high resolution resist patterns. The resolution however, is limited by proximity effects which are due to scattering of the electron-beam as it passes through the resist. In the disclosed method, those proximity effects are compensated for by making the energy that is absorbed by the resist from the electrons, substantially greater at the perimeter of each shape in the pattern than at the interior of those shapes by using extra energy dosage at the perimeter.

U.S. Pat. Nos. 4,426,564 and 4,504,558 issued Jan. 17, 1984, and Mar. 12, 1985, to Bohlen et al. entitled METHOD OF COMPENSATING THE PROXIMITY EFFECT IN ELECTRON BEAM PROJECTION SYSTEMS describes a system for compensating scattering losses of electrons in photoresists (proximity effect) which influence electron beam lithography by altering the pattern geometry and exposing selected partial areas of a pattern to an additional irradiation dosage in a second exposure step. For that purpose, a specific mask with corresponding correction openings can be used which is applied with the same, or with a different electron beam intensity. In a particularly advantageous manner, the correction of the proximity effect can be achieved when complementary masks are used; the correction openings for the partial areas of the once complementary mask are arranged in the other complementary mask. The proximity effect is then corrected without an additional exposure step. For measuring the proximity effect, a photo-optical process is suggested where line patterns with decreasing ridge width in the photoresist are defined through electron beam projection, and where the developing process of the photoresist is discontinued prematurely. The ridge edges which in the presence of proximity effect are asymmetrical, can be easily detected under the microscope.

In U.S. Pat. No. 4,498,010 issued Feb. 5, 1985, to Biechler et al., entitled VIRTUAL ADDRESSING FOR E-BEAM LITHOGRAPHY, a technique is performed in a fixed address particle beam lithographic system where the writing is performed in the normal manner for writing a pattern, for example, a stripe on a resist having a selected feature width except that an additional row of alternate pixels is written either before or after the selected feature is written. The alternate pixels, when the resist is developed, will provide a feature width of approximately ½ a pixel wider than the selected feature width due to blurring of the latent image caused by scattering of the particle beam within the resist. Thus, the resolution of selectable feature widths is enhanced with little or no loss of throughput. The same technique can also be utilized to lengthen a feature by ½ a pixel width. The technique is disclosed primarily in a raster scan machine but also disclosed is the technique in a vector scan machine. Also disclosed is a flow chart showing the invention used while preparing the data to be written by the machine.

In U.S. Pat. No. 4,520,269, issued May 28, 1985, to Jones entitled ELECTRON BEAM LITHOGRAPHY PROXIMITY CORRECTION METHOD, proximity effect is reduced or eliminated by breaking each shape of a lithographic exposure pattern into two parts, a perimeter part having a width on the order of the lithographic exposure pattern minimum line width and the remaining central part or parts (if any) which are completely surrounded by the perimeter part. The lithographic exposure pattern is then modified by moving or setting back the edges of each central part away from the perimeter part which surrounds it (similar to reducing the size of the central part) to form a nominally unexposed band separating each central part from the perimeter part which surrounds it.

The width of the nominally unexposed band in the modified exposure pattern is preferably chosen as large as possible so long as the condition is met that upon developing a radiation sensitive layer directly exposed to the modified exposure pattern, the nominally unexposed band develops (i.e., dissolves, resists dissolution, or is otherwise modified) substantially as it were also exposed. The nominally unexposed band is exposed, in fact, by electrons scattered from the directly exposed part(s) of the shape (the perimeter part plus the central part, if any). The width of the nominally unexposed band is preferably about twice the edge bias applied to outside edges of each shape.

European Patent Application 83106013.2, Publication Number 0097903, by Komatsu, filed June 20, 1983, entitled METHOD OF ELECTRON BEAM EXPOSURE, describes a method of electron beam exposure comprising selectively exposing a resist film, on a substrate a plurality of times with an electron beam whose dose is lower than a desired dose sufficient to produce a difference in molecular weight between the exposed area and nonexposed area, the cumulative dose corresponding to said desired dose.

European Patent Application 83303812.8, Publication Number 0098177, filed June 30, 1983, by Osada, entitled SCANNING ELECTRON-BEAM EXPOSURE SYSTEM, describes a scanning electron-beam exposure system for exposing a desired rectangular area which is larger than a predetermined maximum rectangle wherein the desired rectangular area is divided into a plurality of areas. Two sets of such divided areas are shifted two-dimensionally from each other. The one set of divided areas are exposed with half of a predetermined electron-beam dose and the other set of divided areas are also exposed with half of the predetermined dose. This serves to reduce undesirable effects at boundaries between scanned areas.

European Patent Application 83302399.7, Publication Number 0097417, filed Apr. 28, 1983, by Owen, entitled ELECTRON BEAM LITHOGRAPHY, describes an electron beam lithography system wherein a beam of incident electrons exposes a preselected circuit pattern in a thin resist layer deposited on top of a substrate to be etched. Some of the electrons scatter from the substrate back into the resist layer producing an undesired exposure which produces variable resolution of features. In accordance with the disclosed technique, the region of the resist which is complementary to the desired circuit pattern is also exposed by an electron beam which has been adjusted to produce an exposure approximating that due to backscattering. This additional exposure removes the spatial variability in resolution attainable by the electron beam lithography.

European Patent Application 85303998.0, Publication Number 0166549, filed June 5, 1985, by Pavkovich, entitled METHOD FOR PROXIMITY EFFECT CORRECTION IN ELECTRON BEAM LITHOGRAPHY SYSTEMS, describes a method for electron beam lithography writing of a micro-miniature pattern P(x,y) in a resist-coated workpiece, the method comprising the steps of calculating, at a plurality of grid points on the workpiece, the electron dosage required to produce uniform exposure of the pattern P in accordance with the expression $$\frac{1}{A + B \cdot (P*S)} + \frac{B^2 \beta b^2}{2} [\nabla \cdot (P*S)]^2$$

where S represents the backscattered exposure distribution produced by an incident electron beam, and A, B and $\beta$ are constants. The pattern is then written on the workpiece with the electron beam while varying the applied electron dosage in accordance with the calculated values of required electron dosage, in a preferred embodiment, the electron dosage applied by the electron beam lithography system is varied between a number of discrete levels. The features of the pattern P are partitioned into subfeatures in accordance with the calculated values of required electron dosage. The subfeatures are then assigned to one of the discrete dosage levels of the system.

Russian Patent Application 938339, publication date June 23, 1982, by Ulianov, entitled METHOD OF ELECTRONOLITHOGRAPHY, describes a technique to eliminate the influence of scattered electrons during the exposure of a resist in electron beam lithography by surrounding the border areas between the semiconductor substrate and resist with an electrical field which deflects electrons toward the semiconductor substrate.

In *IBM Technical Disclosure Bulletin*, Vol. 20, No. 9, February 1978, at page 3809, the publication "Partitioning E-Beam Data For Proximity Corrections" by T. P. Chang et al. describes an algorithm for solving the proximity effect problem due to the partial exposure of resist near a shape written by an E-beam due to electron scattering in the resist and substrate. The shape written near to the original one should have its exposure corrected because of the fact that some of the resist in which it is written has been partially exposed in writing the first shape. There are two steps to this method for solving this problem:

1. The second shape must be subdivided into two (or more) shapes so that it now consists of a shape which lies on unexposed resist and one which lies on the resist partially exposed by writing the original shape which preceded it.
2. The subshapes can now be given different exposures, depending on whether they lie in partially exposed or unexposed resist.

In *IBM Technical Disclosure Bulletin*, Vol. 26, No. 12, May 1984, at page 6291, the publication by W. J. Guillaume et al. entitled "Proximity Correction Technique for Electron-Beam Tools" points out that proximity correction algorithms are required to vary electron-beam dose levels to compensate for intra proximity effects and tool focus deviations and discloses a method for determining which shapes are to be presented to the proximity correction algorithm for dose assignment. The technique provides smoother dose transition, consistent dose assignment, and dramatically reduces proximity correction algorithm processing time.

The method operates on electron-beam mask writing shape data with the following steps.

1. The outside edges of the shapes are separated from the interior, reflecting the observation that dose assignment to the edges is far more critical than dose assignment to the interior.
2. The interior shapes are assigned an empirically determined dose and are not corrected any further, dramatically reducing proximity correction algorithm processing time.
3. The edges are divided into coarse segments of 40-50 micrometers to minimize the number of neighboring shapes and reduce the overall execution time.
4. The neighborhood of shapes in the immediate vicinity of each coarse segment is built by including all shapes within a predefined radius around the coarse segment. This occurs in an algorithmically reproducible manner, thus assuring that similar shapes in similar environments will be assigned similar doses.
5. All of the coarse segments are subdivided further to provide more accurate dose assignment in small local areas.
6. The proximity correction algorithm assigns a dose to each subdivided coarse segment.
7. After dose assignment is completed, shapes with the same dose are merged together and an electron writing beam pattern is produced.

In the publication entitled "Proximity effect in electron-beam lithography", by T. H. P. Chang in *J. Vac. Sci. Technol.*, Vol. 12, No. 6, November/December 1975, at page 1271, a simple technique for the computation of the proximity effect in electron-beam lithography is presented. The calculations give results of the exposure intensity received at any given point in a pattern area using a reciprocity principle. Good agreement between the computed results and experimental data was achieved.

The publications in *J. Appl. Phys.*, 50 (6), June 1979, at pages 4371, 4378 and 4383, "Corrections to proximity effects in electron beam lithography. (I. Theory) (II. Implementation) (III. Experiments)" by M. Parikh disclose three correction techniques for proximity effects. The self-consistent technique computes the incident electron dose such that identical average specific exposure occurs in each written shape of the pattern. A unique solution, that depends only on the form and on the magnitude of proximity function, is obtained. The unaddressed-region compensation technique attempts to compensate for proximity effects in regions between shapes. This, however, leads to computational complexities and impracticalities. The shape-dimension adjustment technique attempts to compute dimension of exposed shapes such that the shapes developed in the resist will have the designed dimension. A set of nonlinear (and impractical) equations are obtained in this case. The implementation of these techniques and the experimental results obtained therefrom are the subject of the two succeeding papers (II and III).

In the publication, "Proximity effect correction for electron beam lithography by equalization of background dose" by G. Owen et al., *J. Appl. Phys.*, 54 (6) June 1983, at page 3573, it is disclosed that compensation for the proximity effect in electron lithography can be achieved by equalization of the backscattered dose received by all pattern points. This is accomplished by exposing the reverse tone of the required pattern with a calculated beam diameter and electron dose.

The publication "Proximity effect correction calculations by the integral equation approximate solution method" by J. M. Pavkovich, *J. Vac. Sci. Technol.*, B4 (1) January/February 1986, at page 159 describes a method which provides a relatively accurate approximate solution to the integral equation which is easy to calculate and which provides information on where features should be fractured to obtain good dose compensation.

The publication "Measurements of electron range and scattering in high voltage e-beam lithography" by P. M. Mankiewich et al., *J. Vac. Sci. Technol.*, B3 (1) January/February 1985, at page 174, states that proximity effect from electron scattering is a major limitation to using e-beam lithography for high density, submicron patterns At higher voltages, the proximity effect becomes a relatively uniform background dose without the local pattern distortions characteristic of conventional e-beam lithography at lower voltages. However, the total magnitude of the effect is not reduced and its variation over longer distances remains a serious problem.

The publication, "Proximity correction on the AEBLE-150" by O. Otto et al., *J. Vac. Sci. Technol.*, B6 (1) January/February 1988, at page 443, describes a variant of Parikh's self-consistent method. Rather than requiring equal average exposure for every shape, this method requires equal exposure at a single "test point" in each shape or sub-shape. The locations of the test points are chosen according to specific rules. As in Parikh's method, a set of simultaneous equations is constructed and solved numerically to obtain the doses to be applied to each shape.

The publication, "Proximity correction on a vector scan e-beam machine by dosage variation" by B. J. Hughes et al., *Microelectronic Engineering*, 9 (1-4) May 1989, at page 243, describes yet another variation on Parikh's self-consistent method. As in Parikh's method, the doses are chosen to equalize the total average exposure received by each shape or sub-shape. The influence coefficients which define the resulting simultaneous equations are computed by a technique of "dose sampling" at meshes of grid points which are placed over each shape.

The publication, "Proximity effect correction for high-voltage electron beam lithography" by T. Abe et al., *J. Appl. Phys.*, 65 (11) June 1989, at page 4428, describes an approximate dose correction method which is especially effective for a high acceleration voltage. An approximate formula is described which expresses the backscatter dose correction at any point as a simple sum of contributions from nearby shapes.

SUMMARY OF THE INVENTION

An object of the present invention is to provide a method for proximity effect correction in electron beam lithography, suitable for high beam voltages and/or for very dense patterns.

Another object of the present invention is to provide a method for proximity effect correction in electron beam lithography by dose correction.

A further object of the present invention is to provide a method of dose correction for reducing proximity effects in high voltage electron beam lithography wherein cells are imposed on a chip pattern and a correction process is applied based on fractional shape density matrices of patterns.

Still another object of the present invention is to provide a proximity effect correction technique for electron beam lithography including backscattering corrections and forward scattering corrections.

According to the present invention, the backscatter dose corrections are determined as follows. The process begins by superimposing on the pattern of interest a mesh of square cells, whose size is $\beta/a$. To compute the backscatter correction required for shapes within a given cell, its interaction with all other cells with a radius of $c\beta$ must be considered. $\beta$ is the electron backscatter range, and values for a and c may be empirically determined. Two matrices are computed, a "Proximity Matrix" P and a "Fractional Density Matrix" F. The Proximity Matrix P is computed using any of a variety of approximate or exact linear solutions to the backscatter problem. The elements, $F_{ij}$, of the Fractional Density Matrix are the fractional shape coverage in cells $C_{ij}$. For computational convenience, the Fractional Density Matrix is extended by adding a rectangular "collar" of elements around it. Then, a Dose Correction Matrix D is computed by convolving the P and F matrices. The final backscatter corrections are assigned to each shape either as area-weighted averages of the D matrix elements for all cells spanned by the shape, or more accurately by polynomial or other interpolation of the correction field defined by the D matrix.

The Dose Correction Matrix produced by this method contains sufficient information to be useful as a basis for making automatic decisions on shape fracturing for optimal proximity correction.

Optionally, forward scattering correction may be included in the correction process. Forward scattering correction consists of boosting the dose applied to shape i by a factor $b_i$. These boost factors are computed in a separate and independent step which considers only forward scattering. They may be computed using any desired algorithm; for example, the one specified by Parikh in the *J. Appl. Phys.* publication. These boost factors may be combined with those resulting from the backscatter correction scheme in two ways. The dose correction factors resulting from each separate phase of correction may simply be multiplied together to form the final correction factors. Alternatively and more accurately, the forward-scatter boost factors may be inputted to the backscatter correction scheme as numerical weights for each shape.

BRIEF DESCRIPTION OF THE DRAWINGS

The foregoing and other objects, aspects and advantages of the invention will be better understood from the following detailed description of the preferred embodiment with reference to the drawings, in which.

DETAILED DESCRIPTION OF THE PREFERRED EMBODIMENT OF THE INVENTION

In lithographic methods of fabricating integrated microelectronic circuits, it is common practice to cover a layer of some material which is to be patterned with a layer of electron sensitive resist. Subsequently, various portions of the resist which correspond to the pattern that is to be formed on the underlying material are bombarded with a scanning electron beam. This changes the solubility of the resist in the bombarded regions. Then either the bombarded portions of the resist or the unbombarded portions may be selectively removed by exposing the resist to a suitable etchant and the portions of the resist which thereafter remain are then used as a mask for patterning the underlying material.

Conventionally, the bombarding electrons have energies in the range 15 to 25 keV. However, for practical engineering reasons (which are not directly relevant to the present invention), it is becoming increasingly common for higher electron voltages, in the range of 50 to 100 keV, to be used.

A limitation to the effectiveness of the electron beam lithographic technique is caused by electron scattering. Electron scattering refers to the fact that as the electron beam passes through the resist, some of those electrons collide with the molecules of the resist and are thereby scattered in various directions. Thus, the amount of energy which a particular point in the resist receives is not simply a function of the energy of the overlying electron beam, but it is also a function of the energy and all of the electron beams which are in close proximity to that point. This is a problem because all of the points in the resist portions that are bombarded do not receive the same number of scattered electrons. Consequently, the solubility of the bombarded resist portions varies from one point to another, and this limits the fidelity with which the resist can be patterned.

The electron scattering effects are usually represented quantitatively by a double Gaussian model. This model represents the radial distribution f(r), or energy deposited at a given depth in a substrate by electrons scattered from a nominal point source, as follows:

$$f(r) = \frac{1}{\pi(1 + \eta)} \left\{ \frac{1}{\alpha^2} \exp\left[\frac{-r^2}{\alpha^2}\right] + \frac{\eta}{\beta^2} \exp\left[\frac{-r^2}{\beta^2}\right] \right\} \quad (1)$$

The forward scattering width $\alpha$ is in practice used to account both for electron scattering on entry to the substrate and for the finite beam spread in real e-beam systems. For high-resolution applications, the beam spread dominates and $\alpha$ may be as much as 25% of the minimum feature size. The backscattering width $\beta$ is typically 3 to 4 $\mu$m at 25 keV, and is usually larger than the minimum feature size. $\eta$, the ratio of total backscattered energy to total forward scattered energy, is typically 0.5 to 0.9 at 25 keV.

The effect of increased voltage on the parameters $\alpha$, $\beta$, and $\eta$ is as follows. The relationship of $\alpha$ to minimum feature size probably will not change significantly (i.e., tools will always be operated close to the limits of their resolution). The ratio $\eta$ depends only weakly on beam voltage (i.e., the importance of backscattering does not diminish as beam voltage increases). $\beta$ increases approximately as the 1.7th power of the electron energy. Thus at 50 keV, typical $\beta$ values are 9 to 15 $\mu$m.

In the prior art, it is known that to obtain high quality patterning at small critical dimensions, the backscattering proximity effects must be corrected. For leading edge applications, it is also necessary to correct for forward scattering effects. The objective of such corrections is to approximately equalize the total energy density deposited in all shapes irrespective of their local environments. Such correction is required both at conventional electron beam energies of 15 to 25 keV, and also at higher energies (above 25 keV).

For vector scan and shaped beam machines, where the applied electron dose can be adjusted dynamically on a shape-by-shape basis, the preferred correction method is to adjust the electron dose applied to each shape according to its local environment. The required dose for each shape must be computed numerically, according to some algorithm which takes account of the local environment of the shape.

The most efficient existing methods and algorithms for computing these corrections approximate the dose correction for each shape as a sum of contributions from each nearby shape, the individual contributions being a function only of $\alpha$, $\beta$, $\eta$, and the relative geometrical configurations of the pair of shapes concerned. Self-correction of a shape is not a special case for these algorithms. Such an algorithm is disclosed, for example, by Pavkovich in the *J. Vac. Sci. Technol.* publication.

Proximity correction programs incorporating such algorithms give good results, and have acceptable CPU time requirements, for 25 keV lithography at all feature sizes down to 0.5 $\mu$m. For example, for dense patterns at 0.5 $\mu$m minimum feature sizes, in chips on the order of 5 mm square, with 25 keV lithography, the computational effort can be on the order of $10^3$ to $10^5$ CPU seconds on an IBM 3090 mainframe computer.

However, as minimum feature sizes shrink to 0.25 $\mu$m and below, and as high voltage electron beam tools come into use, the CPU time usage of these existing methods increases dramatically. For the above example, if the features are shrunk to 0.25 $\mu$m and the electron beam voltage is increased to 50 keV, the required CPU time will increase to be 50 to 100 times larger. The situation rapidly gets even worse as electron energy increases and feature sizes decrease.

This runtime problem arises for the following reasons. In computing the backscattering corrections, it is necessary to consider an interaction range around each shape of radius $c\beta$ (where c is typically about 2). Therefore, the computational effort involved is proportional to $\beta^2$. Doubling the electron voltage approximately quadruples $\beta$, and thereby increases the runtimes roughly 15-fold. In shrinking a given pattern to smaller feature sizes while retaining exactly the same total number of shapes, the computational effort is also proportional to $d^{-2}$, where d is the minimum feature size. This follows from considerations of mean shape density. Combining these effects, one obtains the prediction of dramatic increases in cpu time stated above.

Figure 1:
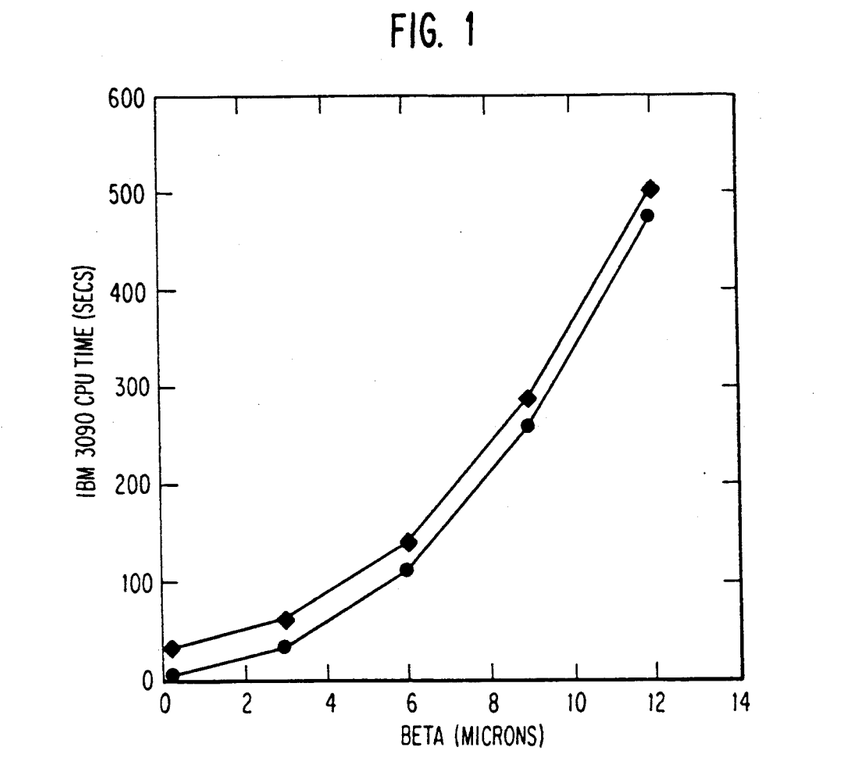
FIG. 1 is a graph of postprocessor runtimes, for a fragment of a dense memory chip level, as a function of $\beta$.

FIG. 1 is a graph showing experimental verification of the predicted dependence of runtime on $\beta$ at a constant minimum feature size of 0.5 μm. The input to this experiment was symbolic design data for a small fragment of a dense memory chip level. FIG. 1 shows the cpu time usage of an IBM 3090 computer, as a function of $\beta$, for the postprocessor program which prepares this data for exposure on the IBM EL-3 shaped beam tool. Also shown is the proportion of this time devoted to proximity correction. The predicted $\beta^2$ dependency is clearly exhibited, and at $\beta = 12$ μm, proximity correction accounts for about 96% of the total runtime.

Such increases in CPU time usage are not merely undesirable cost-wise, but are actually so dramatic as to make the proximity correction process completely impracticable for large commercial chip designs. The implied runtimes are on the order of hundreds of CPU hours.

A new method for dose correction in high voltage, high-resolution e-beam lithography is disclosed herein. The method can give accurate results with relatively modest CPU time requirements, and the CPU time dependence on $\beta$ and minimum feature size is the exact inverse of existing algorithms.

The method is first described as applied purely to long range (backward) scattering correction. Its extension to include forward scatter correction is then disclosed.

Figure 2:
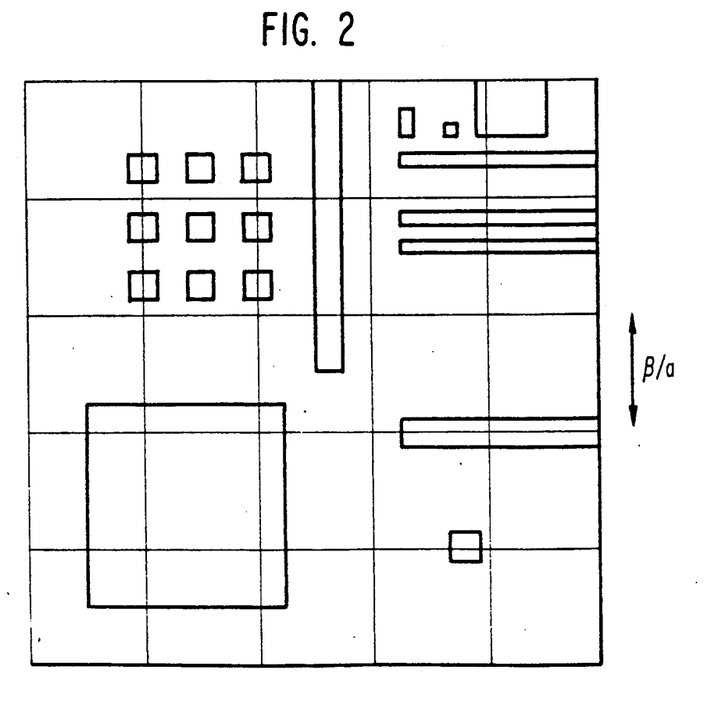
FIG. 2 is a schematic diagram of a mesh of cells superimposed on a chip pattern according to the principles of the present invention.

As shown in FIG. 2, a mesh of square cells, whose size is some fraction of $\beta$, for example $\beta/a$, is superimposed on the pattern of interest. Each cell is labeled by a pair of integers in a (row, column) notation, starting from (1,1) at the top left. Thus, for a chip size of, for example, X by Y, the cells are denoted $C_{ij}$ ($i = 1, 2, \ldots, M; j = 1, 2, \ldots, N$), where $$M = II\left(\frac{Ya}{\beta}\right) + 1, \quad (2)$$

$$N = II\left(\frac{Xa}{\beta}\right) + 1, \quad (3)$$

and the "I" operator truncates to the next smaller integer.

a is chosen such that, to within some acceptable tolerance such as a few parts per thousand, the backscattered energy density delivered to any point in the pattern by shapes (or shape fragments) in a given cell is independent of the exact distribution of shapes (or shape fragments) within the cell. Thus, this energy density depends only on $\beta$, the fractional shape coverage within the cell, the dose applied to shapes in the cell, and the distance from the center of the cell to the point concerned. Such a choice of cell size implies that, to a similar tolerance, all shapes or shape fragments within the cell may be assigned the same dose after backscattering corrections have been applied.

To compute the dose correction required for shapes (or shape fragments) within a given cell, its interaction with all other cells within a radius $c\beta$ must be considered. For convenience of presentation, this circular interaction range is expanded to its exscribed square (conceptually increasing the required work by about 27%). Thus, the interaction of each cell with approximately $(2ac)^2$ other squares must be considered. Note that this number is independent of $\beta$. If $$n = I(ac) + 1, \quad (4)$$

then the number of cells influencing any given one is $(2n+1)^2$.

Suppose now that the cell of interest, together with the $(2n+1)^2 - 1$ surrounding ones, are completely filled with shapes. Then existing linear-combination algorithms, such as provided in the Pavkovich *J. Vac. Sci. Technol.* publication, would approximate the dose correction for the cell of interest by a sum of terms, each term being a function only of $\beta$ and the relative geometrical configuration of two cells. The individual cell-cell correction terms defined by such an algorithm may conveniently be arranged into a matrix, the "Proximity Matrix". This matrix is denoted as P, with elements $P_{kl}$ ($k = -n, \ldots, n; l = -n, \ldots, n$). k and l label the surrounding cells such that the term $P_{kl}$ refers to the interaction of cell $C_{ij}$ with cell $C_{i+k,j+l}$. Thus, $P_{00}$ is the self-correction term. For convenience, the discussion here is expressed in dose units such that the base dose (that applied to an infinitely large shape) is 1.0. Then the dose to be applied to an infinitely small isolated shape is $(1+\eta)$ and the sum of all elements of the proximity matrix (for sufficiently large n) is $-\eta$. Note that the Proximity Matrix is negative definite, because the dose reductions mandated by the presence of nearby shapes are cumulative; there is no cancellation of terms of opposing sign when the correction terms are totalled up.

Figure 3A:
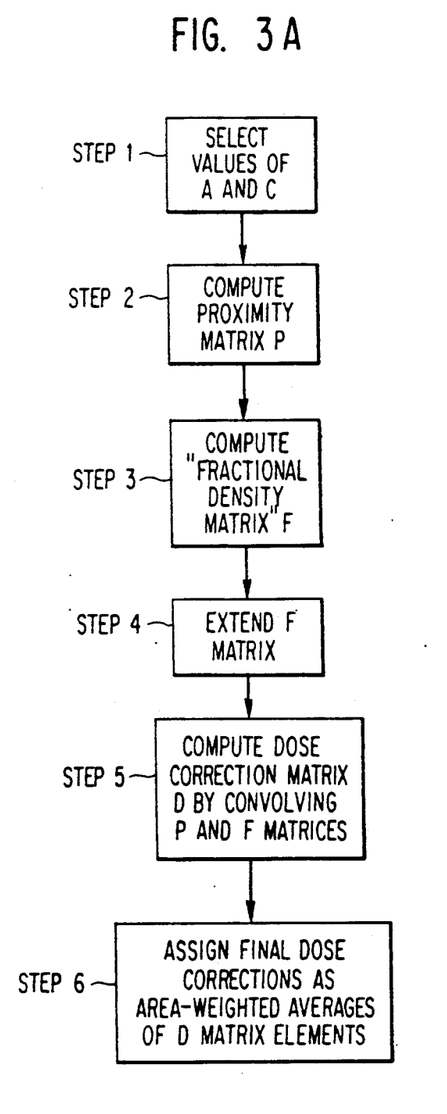
FIGS. 3(a) and 3(b) are flow diagrams illustrating the steps of the backscatter correction algorithm in two preferred embodiments according to the invention.
Figure 3B:
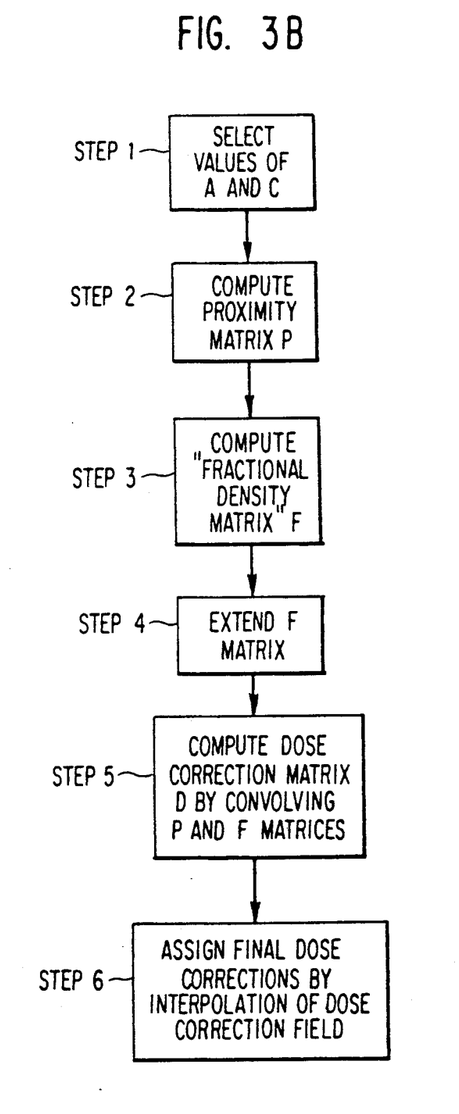

In its simplest form, the backscatter correction method is now summarized as follows with reference to FIGS. 3(a) and 3(b):

Step 1. Choose suitable values of c and a.

Step 2. Use any prefeHxed linear-combination proximity correction algorithm to compute the Proximity Matrix P.

Step 3. Process the pattern data to compute a "Fractional Density Matrix" F, such that $F_{ij}$ is the fractional shape coverage in cell $C_{ij}$. This is a straightforward "binning" operation; no computationally intensive sorting is needed. $F_{ij}$ ranges from 0.0 for an empty cell to 1.0 for a completely full cell.

Step 4. For computational convenience, extend the F matrix by adding a rectangular "collar" of elements around it. The collar is of width n elements, and all of these elements have the value zero. Thus the extended F matrix has elements $F_{1-n,1-n}$ and $F_{M+n,N+n}$ as its top left and bottom right corners respectively. This collar represents the empty space surrounding the pattern. It is not an essential feature of the invention.

Step 5. Compute a Dose Correction Matrix D by convolving the P and F matrices as:

$$D_{ij} = \sum_{k=-n}^{n} \sum_{l=-n}^{n} P_{kl} F_{i+k,j+l} \quad (5)$$

Step 6. Assign final dose corrections to each shape, either as area-weighted averages of the D matrix elements for all cells spanned by the shape (FIG. 3(a)), or more accurately by averaging over the shape a suitable polynomial or other interpolation function approximating the correction field defined by the D matrix (FIG. 3(b)).

If the resulting dose correction for shape i is denoted by $d_i$, then with the convention that base dose=1.0 and with the above definition of the Proximity Matrix, the final backscatter-corrected dose $s_i$ for shape i is given by:

$$s_i = 1 + \eta + d_i \quad (6)$$

The conceptual validity of this method is now addressed. In the limit as a→∞ (i.e., infinitely small cells), all cells are either full or empty and the F matrix elements are all 0 or 1. This algorithm then reduces to an implementation of existing methods by numerical integration. Therefore this approach is conceptually valid. Its utility depends on how small a value of a may be used in practice to give acceptably accurate results.

Next, the CPU time requirements are analyzed step by step.

In Step 1, default values of the parameters c and a could in practice be chosen by experiment, once and for all, to give a prescribed accuracy for any possible pattern.

Step 2 involves computing a relatively small local convolution matrix (because of symmetry, only about $(2n+1)^2/4$ terms need be explicitly computed). Its runtime would be insignificant.

Step 3 is only included for convenience of presentation, and might be omitted from a practical implementation.

Steps 4 and 6 require only a single pass through the pattern data. Again, the runtime would be insignificant.

Step 5 is the computationally intensive one. It requires a total of $$N_{flop} = 2(2n+1)^2 MN \quad (7)$$

floating point operations (multiplications and additions). Since n is independent of $\beta$ (Equation (5)), Equations (2) and (3) show that the runtime would be proportional to $\beta^{-2}$. In shrinking a given pattern to smaller feature sizes, the total number of squares MN would decrease correspondingly. Thus, in this situation the runtime dependency on minimum feature size is $d^2$.

The CPU time requirements of the new method are now compared with those for existing algorithms.

The above analysis clearly shows that, as $\beta$ increases and d decreases, the new algorithm must at some point become more efficient than the existing ones. The precise crossover point depends on the relative values of $K_1$ and $K_2$ in the expressions $$T_1 = \frac{K_1 \beta^2}{d^2} + C_1 \quad (8)$$

for the runtimes of programs embodying existing algorithms, and $$T_2 = \frac{K_2 d^2}{\beta^2} + C_2 \quad (9)$$

for the runtime of a program embodying the new algorithm. For the existing algorithms, $K_1$ is determined by a relatively lengthy computation required to generate the interaction term for two rectangles or other shapes of arbitrary size and relative orientation. For the new algorithm, each cell-cell interaction is accounted for by a single multiply-and-add operation. However, the value of would depend critically on the required cell size (i.e., on a). Comparing Equations (2), (3), (4), and (7), one sees that the runtime is proportional to $a^4$.

In practice, the value of a required to achieve a specified worst relative error in the computed total doses for a real pattern is considerably smaller than predicted from naive consideration of worst-case errors in the individual cell-cell interaction terms. The reason for this is that Equation (5) specifies convolution of a negative definite matrix (P) with a positive semi-definite one (F). This implies that there is no cancellation of terms with opposite signs. Therefore, the relative errors in the final Dose Correction Matrix cannot be worse than the worst-case error in any individual cell-cell interaction. Moreover, for the final doses to approach this worst-case relative error would require construction of a pathologically bad distribution of shapes around a given cell, such that every surrounding cell was approximately half full of shapes, with the shapes in every cell distributed to cluster away from the given cell. In the context of, for example, a 20 by 20 local convolution, such a pathologically bad distribution is vanishingly unlikely to occur, even in a large chip, for real patterns. Instead, for practical applications, the local convolution would "wash out" the errors in individual cell-cell terms by cancellation of errors with opposite signs. In practice, therefore, the relative errors in the final doses would be expected to be much smaller than the worst-case error in individual convolution terms.

Another factor affecting the relative values of $K_1$ and $K_2$ is vectorizability. The convolution of Equation (5) is ideally suited for use with pipelined vector processing hardware. By contrast, the "neighborhood search" procedures required by existing prior art algorithms are not suited to such hardware.

The theoretical discussion of CPU time requirements is now completed. Some other practical details and implications of the invention are discussed next.

A practical implementation of the convolution Equation (5) requires that not only the densest of patterns be efficiently corrected, but also relatively sparse ones where many cells are completely empty. This may be achieved by flagging empty cells and omitting them from the convolution.

Memory constraints might prohibit retention in memory of the entire F and D matrices for a large chip. In this case, the convolution may be carried out in a segmented manner.

The backscatter correction method of the present invention has application to automatic shape fracturing. Shape fracturing is the process of breaking up a shape into two or more smaller shapes. In the context of proximity correction, this is desirable if the corrected doses which would be assigned to the sub-shapes differ significantly from the average corrected dose which would be assigned to the entire original shape. This in turn depends on the detailed local environment of each shape. Existing prior art postprocessor programs are not in general very useful for this kind of shape fracturing and in certain circumstances, these programs may do an inadequate job of proximity correction.

The Dose Correction Matrix which is calculated in the course of backscatter correction by the method of the present invention provides an ideal database for making decisions on shape fracturing. The dose corrections computed for all cells spanned by a large shape are simply compared and fracturing decisions are made based on the variations in these values across the shape. Thus, the method of the present invention disclosed herein provides an ideal basis for smart, automatic shape fracturing.

The method of the present invention also provides for incorporation of forward scattering corrections, and this aspect is now described. Physically in the lithography process, the requirement for forward scattering corrections arises as follows. The effect of forward scattering is that some fraction of the dose delivered to a shape spills just outside the boundary of the shape. For portions of the shape which abut other shapes, this does not matter because there is, to a good approximation, an equal and opposite spillage from the abutting shape. But for "outside perimeters", that is, parts of the shape boundary which abut empty space, this constitutes a real loss of dose from the boundaries of the nominal shape. Thus, the forward scattering correction essentially consists of boosting the dose applied to shape i by a factor $b_i$ to correct for this spillage. If f is the net fractional dose spillage from a shape, then the appropriate factor will be roughly $1/(1-f)$. In practice, numerous different recipes for forward scatter correction exist in the prior art; however, they all seek to achieve objectives similar to that just described.

This physical picture has two important implications. Firstly, forward scattering correction, because of its short range, requires explicit consideration of the immediate (abutting) environment of each shape. Therefore, an "average shape density" approach is not applicable. Secondly, the forward and backward scattering corrections are at a certain level of approximation mathematically separable. This separability is ultimately a consequence of the difference in length scales between the forward and backward scattering effects. It leads directly to the herein-disclosed methods for inclusion of forward scattering correction.

In all cases, the first step is to compute forward scattering boost factors, separately and independently of any other kind of correction. For computing these factors, any desired or convenient existing algorithm may be used. For example, one could use the algorithm disclosed by Parikh in the J. Appl. Phys. publications, with the backscatter correction turned off (i.e., with $\beta=\eta=0$). In any case, since the interaction of each shape with only relatively few abutting neighbors need be considered, the CPU time needed for forward scatter corrections is expected to be insignificant compared with that needed for backscatter corrections.

Figure 4A:
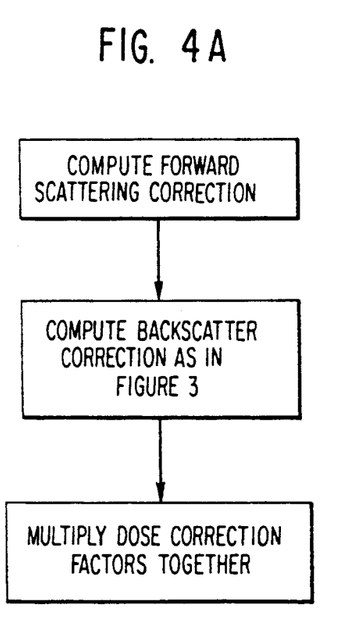
FIGS. 4(a) and 4(b) are flow diagrams illustrating two preferred embodiments of the method used to provide full correction including both forward and backward scattering effects.

In one preferred embodiment of the full correction method, the dose correction factors to account for backward scattering are then computed, completely independently of the forward scatter, using the hereinabove-disclosed method. The back and forward scatter correction factors are then multiplied together to form the final correction factor. This process is illustrated by the flow diagram of FIG. 4(a). In terms of the computed forward scatter boost factor $b_i$, and the backscatter correction $s_i$ defined by Equation (6), the final dose $t_i$ for shape i is given by:

$$t_i = b_i s_i \qquad (10)$$

Figure 4B:
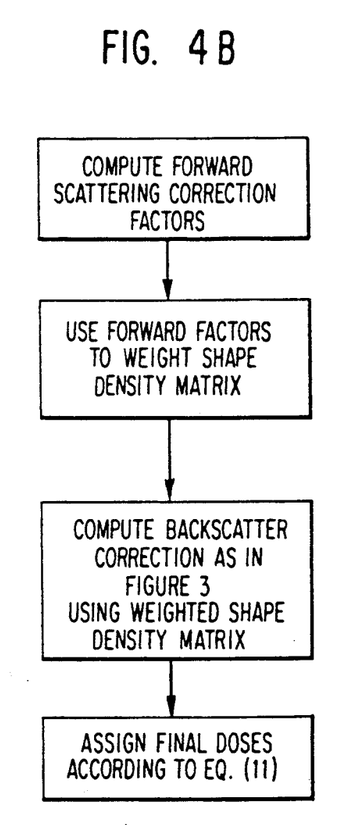

In a second preferred embodiment of the full correction method, the boost factors $b_i$ resulting from the forward scatter calculations are used as input data to the hereinabove-disclosed backscatter algorithm. They are used as weights for each shape during Step 3, the computation of the Fractional Shape Density matrix F. In effect, each shape is assigned a "grey-scale" level. With this change, it is possible for an element of F to exceed 1.0. Other details of the backscatter correction through to computation of the dose correction term $d_i$ are unchanged.

This method is more accurate than the first embodiment, because it explicitly includes the "spilled dose" from forward scatter into the backscatter calculation. This removes the biggest approximation inherent in assuming complete separability of the forward and backward scatter problems. This embodiment is illustrated by the flow diagram of FIG. 4(b). In terms of the forward scatter boost factor $b_i$ and the backscatter correction term $d_i$ (see Equation (6)), the final dose $t_i$ for shape i is now given by:

$$t_i = (1+\eta)b_i + d_i \qquad (11)$$

where the $d_i$ is now computed by the above-specified method but using the weighted version of the Fractional Density Matrix.

Practical implementations of the backscatter algorithm have been made in two computer programs, denoted programs A and B. Program A is a straightforward translation of the algorithm of FIG. 3(a) into FORTRAN. As such, it does not include any interpolation of the final dose correction field. A segmentation capability is included to permit processing of arbitrarily large patterns. The matrix convolution is coded exactly as written in Equation (5), with no tests for sparseness (except that the range of the convolution is limited to the exscribed rectangle of the pattern). This program is run on a conventional IBM 3090 computer with no vector processing facilities. The computer achieves peak hardware speeds of about 10 to 15 Mflops for the kind of computations required. Program B is identical to program A, except for the coding of the matrix convolution. The convolution is coded in optimized S/370 assembler and takes advantage of the S/370 Vector Facility. The latter is a pipelined vector processor with peak hardware speeds of 100 Mflops for the kind of computations required here. The assembler routine includes tests for sparseness in the Fractional Density Matrix and takes advantage of the symmetry of the Proximity Matrix.

A first test pattern in the form of a small fragment (approximately 1% of the total chip) of a dense level (ROX) of a 64K SRAM chip with 0.5 μm minimum feature size was used. The characteristics of this first test pattern are as follows:
  Size: 230 by 320 microns
  Number of Rectangles: 16716
  Shape Coverage: 33.9%
  Shape Density: 229 shapes per 1000 square microns All calculations were carried out for $\eta=0.6$ and with the interaction range $c\beta$ set at $2\beta$. For $\eta=0.6$, the maximum possible range of backscatter-corrected doses is from 100% to 160% of the base dose. For this pattern, the doses computed by the existing postprocessor range from 122% to 150% of base dose at $\beta=3.0$ $\mu$m and range from 130% to 154% of base dose at $\beta=12.0$ $\mu$m. These dose ranges would be considerably greater if forward scattering corrections were included.

The process latitude of IBM's current high-resolution resist systems is such that dose errors of approximately 5% of base dose can be tolerated. The cell sizes for the new programs were accordingly adjusted to give worst-case dose errors (i.e., the worst error for any shape in the pattern as compared with the existing postprocessor) much smaller than this. The required cell sizes, and resulting worst-case errors, are shown as a function of $\beta$ in the following Table I:

TABLE I

| $\beta$ (microns) | Cell Size | Worst Error (% Base Dose) |
|---|---|---|
| 3.0 | $\beta/6$ | 0.6 |
| 6.0 | $\beta/6$ | 0.7 |
| 9.0 | $\beta/6$ | 0.9 |
| 12.0 | $\beta/6$ | 1.1 |

Figure 5:
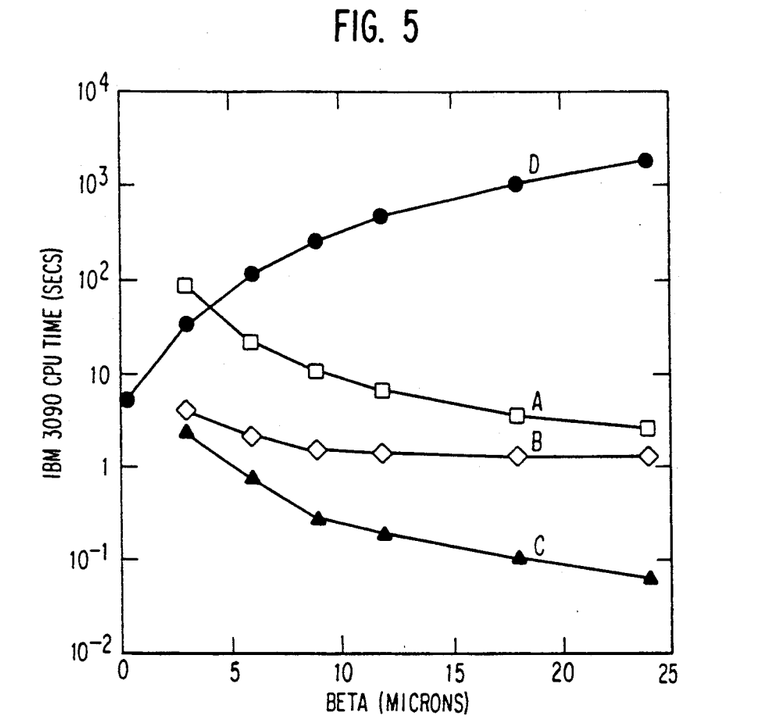
FIG. 5 is a graph showing cpu times for backscatter correction, as a function of $\beta$, for a fragment of a dense memory chip level.

FIG. 5 shows CPU times, as a function of $\beta$, for the two programs A and B, together with the existing postprocessor The range of $\beta$ values has been extended to 24 $\mu$m to simulate the effect on runtimes of shrinking the pattern to 0.25 $\mu$m feature sizes. The runtimes for the existing postprocessor at $\beta=18$ and 24 $\mu$m were obtained by extrapolation. All other values were obtained experimentally, using the cell sizes given above in the case of the programs A and B.

The main conclusions to be drawn from FIG. 5 are as follows:
1. Program B (the vector version) is about 1500 times faster than the existing postprocessor at $\beta=24$ $\mu$m (i.e., for the case of 50 keV and 0.25 $\mu$m features).
2. For this dense pattern, program B is also nearly 10 times faster than the existing postprocessor at $\beta=3$ $\mu$m. This means that the algorithm according to the invention is also attractive for use with dense patterns even at 25 keV.
3. The vectorized program B is about 2–20 times faster than the scalar program A.
4. Curve C represents the contribution of matrix convolution processing to curve B, and demonstrates that matrix convolution is generally the dominant component of the CPU time.
5. Comparing the existing postprocessor at 25 keV (e.g., $\beta=3$) with the algorithm according to the invention at 50 keV (e.g., $\beta=9$), it can be seen that the higher voltage offers a speed-up of about a factor of 20 in backscatter correction for this dense pattern.

A second test pattern, in the form of a proximity effect test pattern with 0.25 $\mu$m minimum feature sizes, was used. The characteristics of the second test pattern are as follows:
Size: 1640 by 1640 microns
Number of Rectangles: 87023
Shape Coverage: 6.5%
Shape Density: 32.5 shapes per 1000 square microns This pattern provides a particularly severe test of the algorithm according to the invention for two reasons. Firstly, the low density of shapes (comparable to that of a relatively sparse logic chip level) favors the existing shape-oriented algorithm compared with the density-oriented algorithm of the invention. Secondly, the pattern is deliberately designed to provide extreme variations in the environments of its shapes and, hence, to require dramatically different doses for different shapes.

All calculations were carried out for $\eta=0.6$ and with the interaction range $c\beta$ set to $2\beta$. For $\eta=0.6$, the maximum possible range of backscatter-corrected does is from 100% to 160% of the base dose. For this pattern, the doses computed by the existing postprocessor range from 100% to 159% of base dose at $\beta=3.0$ $\mu$m and range from 104% to 160% of base dose at $\beta=12.0$ $\mu$m. These dose ranges would be considerably greater if forward scattering corrections were included. The cell sizes for the programs A and B were again adjusted to give worst-case dose errors much less than 5% of base dose. The required cell sizes, and the resulting worst-case errors, are shown as a function of $\beta$ in the following Table II:

TABLE II

| $\beta$ (microns) | Cell Size | Worst Error (% Base Dose) |
|---|---|---|
| 3.0 | $\beta/8$ | 1.2 |
| 6.0 | $\beta/8$ | 1.8 |
| 9.0 | $\beta/10$ | 1.6 |
| 12.0 | $\beta/11$ | 1.7 |

Figure 6:
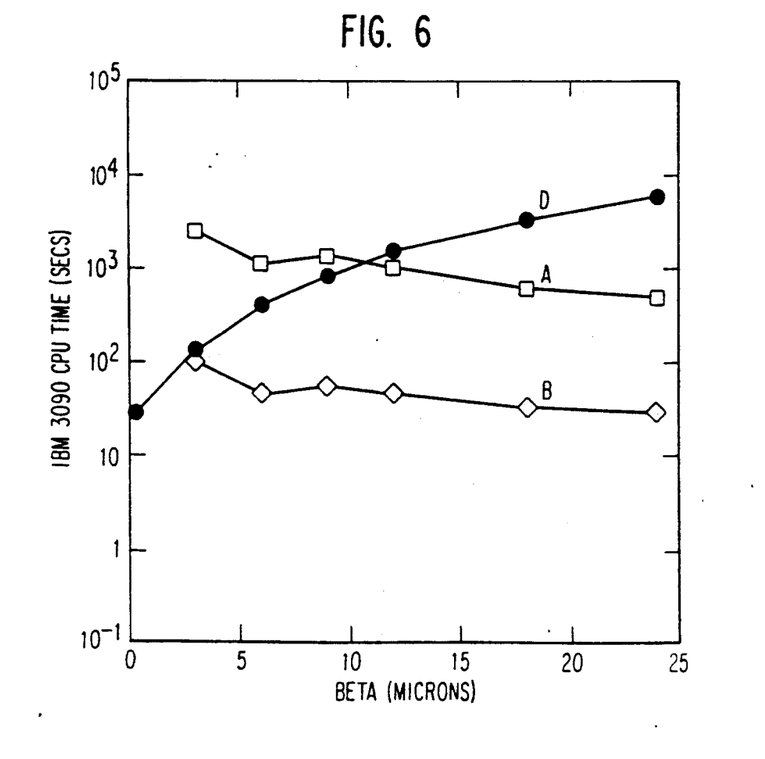
FIG. 6 is a graph showing cpu times for backscatter correction for a relatively sparse proximity test pattern.

FIG. 6 shows CPU times, as a function of $\beta$, for the two programs A and B, together with the existing postprocessor. The range of $\beta$ values has been extended to 24 $\mu$m to simulate the effect on runtimes of shrinking the pattern to 0.125 $\mu$m feature sizes. The runtimes for the existing postprocessor at $\beta=18$ and 24 $\mu$m were obtained by extrapolation. All other values were obtained experimentally, using the cell sizes given above in the case of programs A and B.

The main conclusions to be drawn from FIG. 6 are as follows:
1. New program B (the vector version) is about 200 times faster than the existing postprocessor at $\beta=24$ $\mu$m, about 15 times faster at $\beta=9$ $\mu$m, and runs about the same speed at $\beta=3$ $\mu$m. Thus, the algorithm according to the invention is successful even for this very demanding case.
2. The vectorized program B is about 20 times faster than the scalar program A through the whole range of $\beta$ values.
3. Comparing the existing postprocessor at 25 keV (e.g., $\beta=3$) with the algorithm according to the invention at 50 keV (e.g., $\beta=9$), it can be seen that the higher voltage offers a speed-up of about a factor of 2.5 in backscatter for this sparse pattern.

What has been disclosed is a new correction method for electron beam lithography suitable for high voltages and small feature sizes and/or very dense patterns (in the sense of many shapes per unit area). The new method, expressed as an algorithm, is based on Fractional Shape Density Matrices. It has the merits of running faster and faster, as electron energy increases and feature sizes decrease, and of being ideally suited to implementation on pipelined vector processing hardware.

Having thus described our invention, what we claim as new and desire to secure by Letters Patent is as follows:

1. A backscatter correction method for electron beam lithography suitable for high voltages and small feature sizes and/or very dense patterns so as to make an exposure pattern less sensitive to proximity effects, the exposure pattern consisting of a plurality of shapes, said method comprising the steps of:

superimposing on said pattern a mesh of square cells $C_{ij}$;

computing a proximity matrix P with elements $P_{kl}$ ($k = -n, \ldots, n; l = -n, \ldots, n$), where k and l label the surrounding cells such that the term $P_{kl}$ refers to the interaction of cell $C_{ij}$ with cell $C_{i+k,j+l}$;

computing a fractional density matrix F, such that cells $F_{ij}$ of matrix F are a fractional shape coverage in cells $C_{ij}$;

extending the F matrix by adding a rectangular collar of n elements around the F matrix representing empty space surrounding the pattern;

computing a dose correction matrix D by convolving the P and F matrices as:

$$D_{ij} = \sum_{k=-n}^{n} \sum_{l=-n}^{n} P_{kl} F_{i+k,j+l}$$
$$(i = 1, 2, \ldots, M; j = 1, 2, \ldots, N);$$

assigning a dose correction $d_i$ to each shape as a function of the dose correction matrix; and computing final doses from the dose corrections $d_i$ and modifying the exposure pattern according to these final doses.

2. The method as recited in claim 1 wherein said step of assigning is performed based on area-weighted averages of D matrix elements for all cells spanned by the shape.

3. The method as recited in claim 1 wherein said step of assigning is performed by interpolation of the dose correction field defined by the D matrix.

4. The method as recited in claim 1 wherein a final backscatter-corrected dose $s_i$ for shape i is given by $$s_i = 1 + \eta + d_i,$$

where where $\eta$ is the ratio of total backscattered energy to total forward scattered energy.

5. The method as recited in claim 4 further comprising the steps of:

computing a forward scattering correction boost $b_i$ separately and independently of any other kind of correction; and multiplying the computed backscatter dose correction $s_i$ with the computed forward scattering correction to arrive at said final dose corrections.

6. The method as recited in claim 1 further comprising the steps of:

computing a forward scattering correction boost $b_i$;

using said forward scattering correction boost $b_i$ to weight said F matrix, said D matrix being computed with the weighted F matrix to determine said backscatter correction term $d_i$; and wherein said step of assigning is performed by determining a final dose $t_i$ as $$t_i = (1 + \eta) b_i + d_i,$$

where $\eta$ is the ratio of total backscattered energy to total forward scattered energy.

* * * * *